(12) United States Patent
Kong et al.

(10) Patent No.: US 11,768,988 B2
(45) Date of Patent: Sep. 26, 2023

(54) STANDARD UNIT FOR SYSTEM ON CHIP DESIGN, AND DATA PROCESSING UNIT, OPERATION CHIP AND COMPUTING APPARATUS USING SAME

(71) Applicant: SHENZHEN MICROBT ELECTRONICS TECHNOLOGY CO., LTD., Guangdong (CN)

(72) Inventors: Weixin Kong, Guangdong (CN); Zuoxing Yang, Guangdong (CN); Wenbo Tian, Guangdong (CN); Dong Yu, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/997,319

(22) PCT Filed: Jun. 8, 2021

(86) PCT No.: PCT/CN2021/098910
§ 371 (c)(1),
(2) Date: Oct. 27, 2022

(87) PCT Pub. No.: WO2022/028088
PCT Pub. Date: Feb. 10, 2022

(65) Prior Publication Data
US 2023/0195987 A1 Jun. 22, 2023

(30) Foreign Application Priority Data

Aug. 4, 2020 (CN) .......................... 202010773501.9

(51) Int. Cl.
*G06F 30/39* (2020.01)
*H01L 27/092* (2006.01)

(52) U.S. Cl.
CPC .......... *G06F 30/39* (2020.01); *H01L 27/0922* (2013.01)

(58) Field of Classification Search
USPC ........................................................ 716/138
See application file for complete search history.

(56) References Cited

U.S. PATENT DOCUMENTS 5,629,638 A 5/1997 Kumar
2009/0167343 A1* 7/2009 Marshall ............... H01L 27/092
326/15

(Continued)

FOREIGN PATENT DOCUMENTS

CN 101651829 A 2/2010
CN 103106291 A 5/2013
(Continued)

OTHER PUBLICATIONS

First Office Action issued in Chinese Application No. 202010773501.9.

(Continued)

*Primary Examiner* — Mohammed Alam
(74) *Attorney, Agent, or Firm* — Venable LLP

(57) ABSTRACT

A standard unit (100) for a system on chip design includes a plurality of semiconductor devices and is configured to implement a basic logic function. The standard unit (100) includes a first transistor (110) of a first threshold type and a second transistor (120) of a second threshold type, the second threshold type is different from the first threshold type, wherein a threshold range of the first threshold type is different from that of the second threshold type.

9 Claims, 2 Drawing Sheets

(56) References Cited

U.S. PATENT DOCUMENTS

| | | | | |
|---|---|---|---|---|
| 2010/0070933 A1* | 3/2010 | Quach | ............... | G06F 30/3312 |
| | | | | 716/132 |
| 2013/0105894 A1* | 5/2013 | Brodsky | ........... | H01L 29/66803 |
| | | | | 438/510 |
| 2014/0028348 A1* | 1/2014 | Andreev | ............ | H03K 19/0948 |
| | | | | 716/105 |
| 2014/0176216 A1* | 6/2014 | Thonnart | ............ | H01L 27/0207 |
| | | | | 257/202 |
| 2014/0176228 A1* | 6/2014 | Giraud | .............. | H01L 27/11807 |
| | | | | 327/534 |
| 2014/0266290 A1* | 9/2014 | Odedara | ................. | H01L 22/34 |
| | | | | 324/762.01 |
| 2014/0320168 A1 | 10/2014 | Luo | | |
| 2017/0076031 A1* | 3/2017 | Mittal | ................... | G06F 30/398 |
| 2017/0324385 A1* | 11/2017 | McKay | ............ | H01L 21/67011 |
| 2017/0351802 A1* | 12/2017 | Chang | .................. | G06F 30/394 |
| 2018/0269868 A1* | 9/2018 | Bellaouar | ............ | H01L 29/0649 |
| 2020/0098658 A1* | 3/2020 | Pinkham | ................ | G05D 23/30 |
| 2020/0212896 A1* | 7/2020 | Purushothaman | ............................ | |
| | | | | H03K 3/35625 |

FOREIGN PATENT DOCUMENTS

| | | | |
|---|---|---|---|
| CN | 103532542 | A | 1/2014 |
| CN | 103930998 | A | 7/2014 |
| CN | 104124954 | A | 10/2014 |
| CN | 106528909 | A | 3/2017 |
| CN | 107403052 | A | 11/2017 |
| CN | 107464810 | A | 12/2017 |
| CN | 108631768 | A | 10/2018 |
| CN | 110311655 | A | 10/2019 |
| JP | 2006114833 | A | 4/2006 |
| TW | 201836147 | A | 10/2018 |
| TW | 202028897 | A | 8/2020 |
| WO | 2020106339 | A2 | 5/2020 |

OTHER PUBLICATIONS

Second Office Action issued in Chinese Application No. 202010773501.9.

International Search Report and Written Opinion dated Sep. 8, 2021 in International Application No. PCT/CN2021/098910.

First Office Action issued in Taiwanese Application No. 110120774.

Decision to Grant issued in Taiwanese Application No. 110120774.

Decision to Grant issued in Chinese Application No. 202010773501.9.

International Preliminary Report on Patentability dated Nov. 18, 2021 in International Application No. PCT/CN2021/098910.

First Search Report issued in Chinese Application No. 202010773501.9.

Supplementary Search Report issued in Chinese Application No. 202010773501.9.

Second Office Action issued in Chinese Patent Application No. 202010773501.9.

* cited by examiner

STANDARD UNIT FOR SYSTEM ON CHIP DESIGN, AND DATA PROCESSING UNIT, OPERATION CHIP AND COMPUTING APPARATUS USING SAME

CROSS REFERENCE TO RELATED APPLICATIONS

The present application is a U.S. national stage entry of International Application No. PCT/CN2021/098910, filed Jun. 8, 2021, entitled "STANDARD UNIT FOR SYSTEM-LEVEL CHIP DESIGN AND DATA PROCESSING UNIT, COMPUTATIONAL CHIP, AND COMPUTING DEVICE USING SAME", which claims priority to Chinese Patent Application No. 202010773501.9, filed Aug. 4, 2020, entitled "STANDARD UNIT FOR SYSTEM ON CHIP DESIGN, AND DATA PROCESSING UNIT, OPERATION CHIP AND COMPUTING APPARATUS USING SAME", both of which are hereby incorporated by reference in their entireties.

TECHNICAL FIELD

The present disclosure generally relates to the standard unit for the system on chip design, and the data processing unit, the operation chip and the computing apparatus using the same, and more particularly, to the standard unit using the hybrid threshold technology, and the data processing unit, the operation chip and the computing apparatus using the standard unit.

BACKGROUND

At present, the multi-threshold voltage design is gradually becoming an important design means in the physical design of the digital circuit. However, the existing multi-threshold design is usually performed at the unit level, that is, the devices in one unit use the same threshold. Taking the commonly used standard unit library as an example, the standard unit library is generally classified according to the threshold of the devices. That is, the standard units used in one standard unit library belong to the same threshold type. For example, each standard unit in the regular threshold (RVT) library only uses the device of the RVT threshold type, and each standard unit in the low threshold (LVT) library only uses the device of the LVT threshold type.

Thus, there is the need for the improved standard unit.

SUMMARY

According to a first aspect of the present disclosure, a standard unit for a system on chip design is provided, the standard unit including a plurality of semiconductor devices and configured to implement a basic logic function, wherein the plurality of semiconductor devices include a first transistor of a first threshold type and a second transistor of a second threshold type; wherein a threshold range of the first threshold type is different from that of the second threshold type.

Preferably, wherein rising delay time and falling delay time of the standard unit are made to be balanced by selecting the first threshold type and the second threshold type.

Preferably, the plurality of semiconductor devices further include a third transistor of a third threshold type, wherein a threshold range of the third threshold type is different from that of the first threshold type and is different from that of the second threshold type, and wherein the rising delay time and the falling delay time of the standard unit are made to be balanced by selecting the first threshold type, the second threshold type and the third threshold type.

Preferably, wherein the first threshold type, the second threshold type or the third threshold type is selected from the following: a regular threshold (RVT) type, a low threshold (LVT) type, a super low threshold (SLVT) type, and a high threshold (HVT) type.

Preferably, wherein the first transistor is an n-type transistor and the second transistor is a p-type transistor; or wherein the first transistor is a p-type transistor and the second transistor is an n-type transistor.

Preferably, wherein the first transistor and the second transistor are both n-type transistors or are both p-type transistors.

Preferably, wherein the standard unit is an inverter, the first transistor is a p-type transistor of a low threshold (LVT) type, the second transistor is an n-type transistor of a super low threshold (SLVT) type, gates of the first transistor and the second transistor are connected to an input end of the standard unit, and drains of the first transistor and the second transistor are connected to an output end of the standard unit.

According to a second aspect of the present disclosure, a data processing unit is provided, the data processing unit including at least one standard unit as described above.

According to a third aspect of the present disclosure, an operation chip is provided, the operation chip including at least one data processing unit as described above.

According to a fourth aspect of the present disclosure, a computing apparatus is provided, the computing apparatus configured to perform an algorithm of mining virtual digital currency, and the computing apparatus including: at least one operation chip as described above, a control chip, a power supply module, and a radiator, wherein the control chip is coupled to the at least one operation chip and is configured to control operation of the at least one operation chip, wherein the power supply module is configured to provide power to the at least one operation chip, the control chip, and/or the radiator, and wherein the radiator is configured to dissipate heat for the at least one operation chip, the control chip, and/or the power supply module.

Through detailed descriptions of exemplary embodiments of the present disclosure with reference to the following accompanying drawings, other features and advantages of the present disclosure become clear.

BRIEF DESCRIPTION OF THE DRAWINGS

The accompanying drawings constituting a part of the description illustrate embodiments of the present disclosure and are used for explaining the principle of the present disclosure together with the description.

The present disclosure may be understood more clearly based on the following detailed description with reference to the accompanying drawings.

Figure 1:
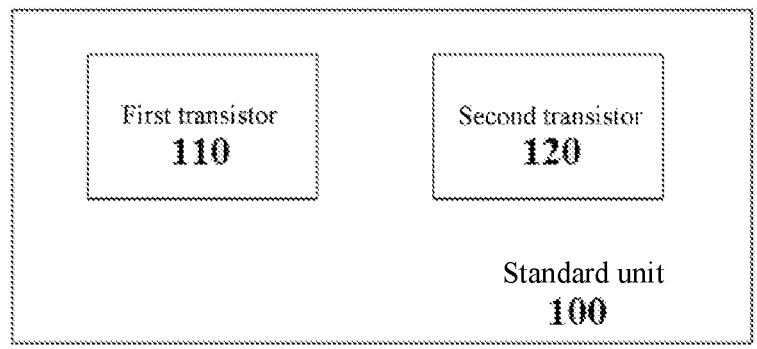
FIG. 1 exemplarily shows a schematic diagram of the standard unit according to an embodiment of the present disclosure.

It is to be noted that in the following implementations illustrated, sometimes the same reference numeral is used in different accompanying drawings to represent the same part or a part with the same function, and repeated illustration thereof is omitted. In the present description, similar reference signs or letters are used for indicating similar items. Therefore, once an item is defined in one accompanying drawing, the item does not need to be further discussed in the subsequent accompanying drawings.

For ease of understanding, the position, size, range and the like of each structure shown in the accompanying drawings may not indicate the actual position, size, range and the like. Therefore, the disclosure is not limited to the position, size, range and the like disclosed in the accompanying drawings. In addition, the accompanying drawings are not necessarily drawn in proportion, and some features may be enlarged to show details of the particular component.

DETAILED DESCRIPTION

Various exemplary embodiments of the present disclosure are described in detail with reference to the accompanying drawings in the following. It should be noted that unless illustrated in detail otherwise, the relative deployment of the components and steps, the numerical expression and the values stated in these embodiments do not limit the scope of the present disclosure.

In fact, the following description of at least one exemplary embodiment is merely illustrative, and is not as any limitation to the present disclosure and to application or use thereof. That is, the structure and the method herein are given in an exemplary manner to illustrate different embodiments of the structure and the method in the present disclosure. However, one skilled in the art will understand that they merely illustrate exemplary, rather than exhaustive manner in which the present disclosure may be implemented. In addition, the accompanying drawings are not necessarily drawn in proportion, and some features may be enlarged to show details of the particular component.

In addition, the technology, method and device known to the person of ordinary skill in the related art may not be discussed in detail, but in proper circumstances, the technology, method and device shall be regarded as a part of the authorized description.

In all examples shown and discussed herein, any specific value should be interpreted only as an example but not as a limitation. Therefore, other examples of the exemplary embodiments may have different values.

The standard unit is the basis of the modern system on chip (SOC) design, which may design some basic logic functions into splicable units in accordance with some principles such as the equal height and the variable width, so as to facilitate the implementation of the complex system by the electronic design automation (EDA) tool later. The balance of the rising delay time and the falling delay time of the standard unit is an important indicator to evaluate the performance of the standard unit, which plays an important role both in optimizing the clock network and in reducing glitch power consumption. In many cases, achieving the balance of the rising delay time and the falling delay time may imply that the rising delay time and the falling delay time are made to be substantially the same.

In the circuit design of the standard unit, the channel length of each transistor is usually set to be the minimum feature size to obtain the best performance. Taking the conventional plane complementary metal-oxide-semiconductor (CMOS) process as an example, on the premise of the fixed channel length, the relatively good balance of the rising delay time and the falling delay time is generally implemented by adjusting the channel widths of the p-type metal-oxide-semiconductor (PMOS) transistor and the n-type metal-oxide-semiconductor (NMOS) transistor. However, this adjustment to the channel width may lead to an increase in the size and the power consumption of the transistor, resulting in the increase in the size and the power consumption of the standard unit. In addition, the adjustment to the channel width is not applicable in many cases. For example, in the fin field-effect transistor (FinFET) process, the adjustable parameter is the quantity of the fins of the transistor. Therefore, there are generally only a few fixed integer values to be selected. In particular, in some high-density standard unit libraries, the quantity of the fins is completely fixed and cannot be adjusted, which makes it very difficult to optimize the balance of the rising delay time and the falling delay time.

To resolve the above problem, the present invention provides the digital standard unit using the hybrid threshold technology, wherein the transistors of different threshold types may be used, so that adjustment to the balance of the rising delay time and the falling delay time of the standard unit can be realized in various cases. The existing standard unit library is one most basic type of the reusable IP libraries, and may be provided by the Foundry (the semiconductor manufacture plant) or the third-party IP supplier. The Foundry or the third-party IP supplier generally provides only the primary standard unit library for the specific process. The standard units in this primary standard unit library are designed for general needs of many customers and use the single threshold type. On this basis, the customer may design or improve the standard unit voluntarily, as the supplement to the primary standard unit library. As long as the standard unit designed or improved voluntarily by the customer conforms to the design rules of the Foundry, the standard unit may be produced by the Foundry. Based on this, the standard unit using the hybrid threshold technology raised in the present invention may be designed voluntarily by the user and be produced by the Foundry. Since in the primary standard unit library provided by the Foundry, generally only devices of one threshold type are used in the standard units of one library, the regular threshold (RVT) library, the low threshold (LVT) library, the super low threshold (SLVT) library and the like may be distinguished. Different from this, the standard unit using the hybrid threshold technology raised in the present invention uses the devices of different threshold types in one standard unit. Therefore, the standard unit does not belong to the existing library that is distinguished by the threshold type, but may be classified into the corresponding standard unit library according to another standard.

Taking the existing standard unit design of a certain FinFET process as an example, the devices of different threshold types such as the regular threshold (RVT) type, the low threshold (LVT) type, the super low threshold (SLVT) type and the like are provided therein. Due to the limitation of the design rule, the quantity of the fins of the device in the high-density standard unit design is fixed to be 2. In a common standard unit design, for the simple inverter circuit, both the NMOS and the PMOS transistors use the devices of the super low threshold (SLVT) type in the process. But it is proposed in the present invention that the NMOS transistor may use the device of the super low threshold (SLVT) type, while the PMOS transistor may use the device of the low threshold (LVT) type, thereby achieving the balance of the rising delay time and the falling delay time. The following will describe specific embodiments according to the present disclosure in detail.

FIG. 1 exemplarily shows a schematic diagram of the standard unit 100 for the system on chip design according to an embodiment of the present disclosure. The standard unit 100 includes a plurality of semiconductor devices and is configured to implement the basic logic function. As shown in FIG. 1, the plurality of semiconductor devices of the standard unit 100 include the first transistor 110 of the first threshold type and the second transistor 120 of the second threshold type, wherein the threshold range of the first threshold type is different from that of the second threshold type.

In an embodiment according to the present disclosure, different threshold types may be implemented by different channel doping concentrations. For example, in the standard unit 100, the channel of the transistor 110 of the first threshold type may have the first doping concentration, and the channel of the transistor 120 of the second threshold type may have the second doping concentration that is different from the first doping concentration. The channel doping concentration is the decisive factor for the transistor threshold. Different threshold types implemented by different channel doping concentrations may include for example the regular threshold (RVT, Regular Vt) type, the low threshold (LVT, Low Vt) type, the super low threshold (SLVT, Super low Vt) type, and/or the high threshold (HVT, High Vt) type, and the like. In the standard unit 100, the first threshold type or the second threshold type may be selected from the regular threshold (RVT) type, the low threshold (LVT) type, the super low threshold (SLVT) type, and/or the high threshold (HVT) type, and the like. One skilled in the art will understand that although some existing threshold types are described above, the embodiments of the present disclosure are not limited thereto, and more threshold types may be used, as long as the use of the threshold type is helpful for achieving the balance of the rising delay time and the falling delay time of the standard unit.

In an embodiment according to the present disclosure, the first transistor 110 and the second transistor 120 may be any type of transistor manufactured by any process, including but not limited to, the MOS transistor, and may preferably be the FinFET transistor.

In the standard unit 100 according to the embodiment of the present disclosure, by selecting the first threshold type and the second threshold type, the rising delay time and falling delay time of the standard unit 100 are made to be balanced.

In an embodiment according to the present disclosure, the rising delay time refers to, after the signal of the input end of the standard unit is stabilized, the delay time required for the signal of the output end of the standard unit to change to the specified upper limit thereof. Therefore, the rising delay time may include the path delay time from the input end to the output end of the standard unit and the time for the signal of the output end to flip from low to high. Similarly, in an embodiment according to the present disclosure, the falling delay time refers to, after the signal of the input end of the standard unit is stabilized, the delay time required for the signal of the output end of the standard unit to change to the specified lower limit thereof. Therefore, the falling delay time may include the path delay time from the input end to the output end of the standard unit and the time for the signal of the output end to flip from high to low.

In the standard unit 100 according to the embodiment of the present disclosure, for different semiconductor processes and different standard unit circuit types, different combinations of threshold types may be used. For example, for the transistors of different doping types, different threshold types may be used, and for the transistors of the same doping type, different threshold types may also be used. Specifically, in some embodiments according to the present disclosure, the first transistor 110 in the standard unit 100 shown in FIG. 1 is the p-type transistor, while the second transistor 120 is the n-type transistor. In some other embodiments according to the present disclosure, the first transistor 110 in the standard unit 100 shown in FIG. 1 is the n-type transistor, while the second transistor 120 is the p-type transistor. In still some other embodiments according to the present disclosure, the first transistor 110 and the second transistor 120 in the standard unit 100 shown in FIG. 1 are both the p-type transistors; and in yet some other embodiments according to the present disclosure, the first transistor 110 and the second transistor 120 in the standard unit 100 shown in FIG. 1 are both the n-type transistors.

In the standard unit using the CMOS technology, the NMOS transistor is usually used for pulling down the signal, that is, the NMOS transistor functions when the output signal flips from high to low; while the PMOS transistor is generally used for pulling up the signal, that is, the PMOS transistor functions when the output signal flips from low to high. To achieve the balance of the rising delay time and the falling delay time of the CMOS standard unit, if the semiconductor process and/or the structure of the standard unit determine that in the case that the NMOS transistor and the PMOS transistor use the same threshold type, the NMOS transistor path is slower while the PMOS transistor path is faster, then the CMOS standard unit according to an embodiment of the present disclosure may use the NMOS transistor of the lower threshold in combination with the PMOS transistor of the higher threshold, such that the NMOS path becomes faster and the PMOS path becomes slower, so as to achieve the balance of the speeds of the NMOS transistor path and the PMOS transistor path, thereby achieving the balance of the rising delay time and the falling delay time. In contrast, if the semiconductor process or the structure of the standard unit determines that in the case that the NMOS transistor and the PMOS transistor use the same threshold type, the NMOS transistor path is faster while the PMOS transistor path is slower, then the NMOS transistor of the higher threshold may be used in combination with the PMOS transistor of the lower threshold, such that the NMOS path becomes slower and the PMOS path becomes faster, thereby achieving the balance of the rising delay time and the falling delay time.

For example, in some embodiments according to the present disclosure, the standard unit 100 may be an inverter, wherein the gates of the first transistor 110 and the second transistor 120 are connected to the input end of the standard unit 100, and the drains of the first transistor 110 and the second transistor 120 are connected to the output end of the standard unit 100. Suppose that the semiconductor process and the structure of the standard unit used by the inverter determines that in the case that the NMOS transistor and the PMOS transistor use the same threshold type, the NMOS transistor path is faster while the PMOS transistor path is slower, then in the inverter, the p-type transistor of the super low threshold (SLVT) type is used as the first transistor 110 and the n-type transistor of the low threshold (LVT) type is used as the second transistor 120, that is, the combination of the PMOS transistor of the lower threshold and the NMOS transistor of the higher threshold is achieved, such that the PMOS path becomes faster and the NMOS path becomes slower, thereby achieving the balance of the rising delay time and the falling delay time of the standard unit 100.

In an embodiment according to the present disclosure, the standard unit 100 may further include the third transistor of the third threshold type. The threshold range of the third threshold type is different from that of the first threshold type and is different from that of the second threshold type. In a preferred embodiment, the rising delay time and the falling delay time of the standard unit 100 may be made to be balanced by selecting the first threshold type, the second threshold type and the third threshold type. In some embodiments, different threshold types may be achieved by different channel doping concentrations of the transistors. For example, the channel of the transistor of the first threshold type has the first doping concentration, the channel of the transistor of the second threshold type has the second doping concentration, the channel of the transistor of the third threshold type has the third doping concentration, and the first doping concentration, the second doping concentration and the third doping concentration are different from one another. Different threshold types realized by different channel doping concentrations may include, for example, the regular threshold (RVT, Regular Vt) type, the low threshold (LVT, Low Vt) type, the super low threshold (SLVT, Super low Vt) type, and/or the high threshold (HVT, High Vt) type, and the like. In the standard unit 100, the first threshold type, the second threshold type, or the third threshold type may be selected from the regular threshold (RVT) type, the low threshold (LVT) type, the super low threshold (SLVT) type, and/or the high threshold (HVT) type, and the like. One skilled in the art will understand that although some existing threshold types are described above, embodiments of the present disclosure are not limited thereto, and more threshold types may be used, as long as the use of the threshold type is helpful for achieving the balance of the rising delay time and the falling delay time of the standard unit.

It is to be noted that although only the standard unit including the transistors of two different threshold types and the standard unit including the transistors of three different threshold types are shown according to the embodiments of the present disclosure, one skilled in the art will understand that the standard unit according to an embodiment of the present disclosure may include any quantity of transistors of any quantity of different threshold types.

Figure 2:
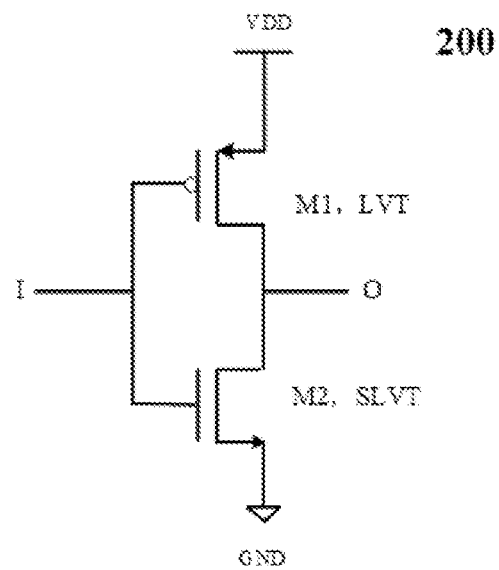
FIG. 2 exemplarily shows a schematic diagram of the standard unit used as the inverter according to a particular embodiment of the present disclosure.

FIG. 2 exemplarily shows a circuit diagram of the standard unit 200 that is used as the inverter according to a particular embodiment of the present disclosure. The standard unit 200 is a particular example of the standard unit 100 shown in FIG. 1. Therefore, the foregoing description about the standard unit 100 may also be applicable, at least in part thereto. Referring to FIG. 2, the standard unit 200 used as the inverter may include the first transistor M1 of the first threshold type and the second transistor M2 of the second threshold type. In the inverter, the gates of the first transistor M1 and the second transistor M2 are connected to the input end I of the standard unit 200, the drains of the first transistor M1 and the second transistor M2 are connected to the output end O of the standard unit 200, the source of the first transistor M1 is connected to the power supply VDD, and the source of the second transistor M2 is connected to the ground GND. The p-type transistor of the low threshold (LVT) type is used as the first transistor M1, and the n-type transistor of the super low threshold (SLVT) type is used as the second transistor M2, so that the rising delay time and falling delay time of the inverter achieve balanced.

In the existing standard unit used as the inverter, the same threshold type is generally selected for the two transistors of the inverter, that is, the single threshold type design, but this causes the imbalance of the rising delay time and falling delay time. The reason is that, for the device of the super low threshold (SLVT) type, the threshold of the PMOS transistor used for pulling up the signal is lower than that of the NMOS transistor used for pulling down the signal. If the common single threshold type design is used, the rising delay time of the inverter will be significantly shorter than the falling delay time of the inverter, resulting in the poor balance of the rising delay time and the falling delay time of the standard unit. Meanwhile, since the maximum operation speed of the standard unit is determined by the slowest path, the faster PMOS path does not bring the improvement of the performance, but brings the cost of the increased dynamic power consumption and the electric leakage.

In contrast, in the standard unit 200 used as the inverter according to an embodiment of the present disclosure, the p-type transistor of the low threshold (LVT) type is used as the first transistor M1 used for pulling up the signal, and the n-type transistor of the super low threshold (SLVT) type is used as the second transistor M2 used for pulling down the signal, so that the rising delay time and falling delay time of the standard unit 200 used as the inverter tends to be balanced without increasing the quantity or the size of the devices, and the dynamic power consumption and electric leakage can be reduced. That is, the standard unit using the hybrid threshold technology according to the embodiments of the present disclosure can achieve the balance of the rising delay time and the falling delay time and reduce the dynamic power consumption and electric leakage without increasing the size and the quantity of the devices, so that the standard unit with better performance is provided.

Figure 3:
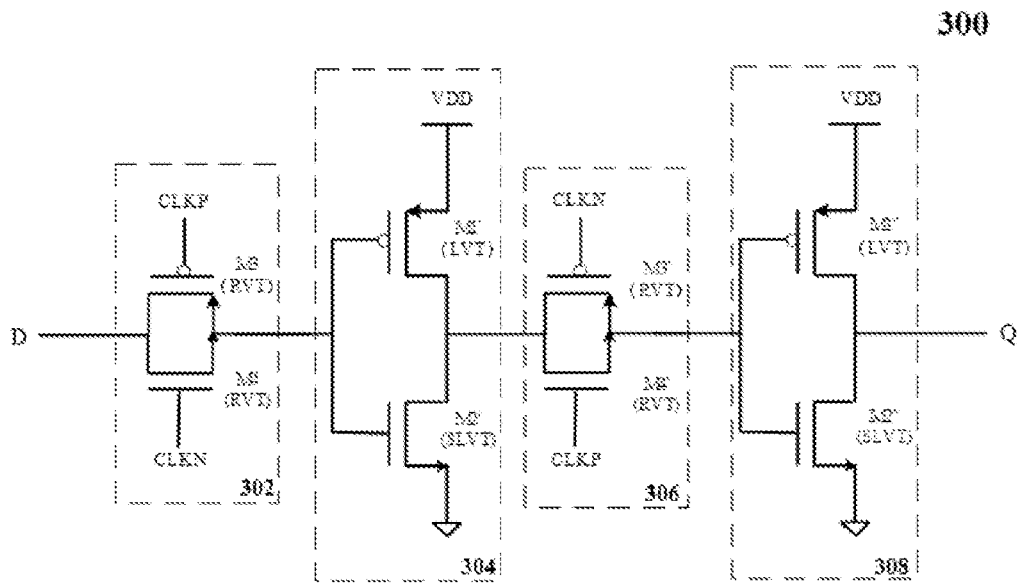
FIG. 3 exemplarily shows a schematic diagram of the standard unit used as the dynamic edge-triggered register according to a particular embodiment of the present disclosure.

FIG. 3 exemplarily shows a circuit diagram of the standard unit 300 used as a dynamic edge-triggered register according to a particular embodiment of the present disclosure. The standard unit 300 is the particular example of the standard unit 100 shown in FIG. 1. Therefore, the foregoing description about the standard unit 100 may also be applicable, at least in part thereto. Referring to FIG. 3, the standard unit 300 is used as the dynamic edge-triggered register, wherein the standard unit 300 includes the transmission gate 302, the inverter 304, the transmission gate 306 and the inverter 308 that are sequentially connected in series between the input end D and the output end Q. In the standard unit 300 used as the dynamic edge-triggered register, the first transistors M1'and M1" of the first threshold type, the second transistors M2' and M2" of the second threshold type and the third transistors M3, M4, M3', and M4' of the third threshold type are included, wherein the first threshold type is selected to be the low threshold (LVT) type, the second threshold type is selected to be the super low threshold (SLVT) type, and the third threshold type is selected to be the regular threshold (RVT) type. In the transmission gate 302, the gate of the p-type third transistor M3 is connected to the clock signal CLKP, and the gate of the n-type third transistor M4 is connected to the clock signal CLKN. In contrast, in the transmission gate 306, the gate of the p-type third transistor M3' is connected to the clock signal CLKN, and the gate of the n-type third transistor M4' is connected to the clock signal CLKP, wherein the clock signals CLKN and CLKP are mutually inverted clock signals.

Referring to FIG. 3, in the standard unit 300 used as the dynamic edge-triggered register, the inverters 304 and 308 use the structure of the inverter shown in FIG. 2. That is, the p-type transistors of the low threshold (LVT) type are used as the first transistors M1 and M1" used for pulling up the signal, and the n-type transistors of the super low threshold (SLVT) type are used as the second transistors M2' and M2" used for pulling down the signal, so that the rising delay time and the falling delay time of each of the inverters 304 and 308 are balanced.

Continuing to refer to FIG. 3, since the transmission gates 302 and 306 are not involved in pulling up or pulling down the signal, the p-type transistors and the n-type transistors in the transmission gates may use the same threshold type. Specifically, in the standard unit 300 used as the dynamic edge-triggered register, the transmission gate 302 includes the p-type third transistor M3 and the n-type third transistor M4 of the regular threshold (RVT) type, and the transmission gate 306 includes the p-type third transistor M3' and the n-type third transistor M4' of the regular threshold (RVT) type. In addition, by selecting the regular threshold (RVT) type for both the p-type transistors and the n-type transistors in the transmission gates 302 and 306, driving capabilities of the transmission gates 302 and 306 can be enhanced without affecting the balance of the delay time.

In the standard unit 300 used as the dynamic edge-triggered register according to an embodiment of the present disclosure, by properly using the hybrid threshold design, on the premise that the size and the quantity of the devices are not increased, the balance of the rising delay time and the falling delay time can be achieved, the dynamic power consumption and the electric leakage can be reduced, and the driving capability can be enhanced, thereby providing the standard unit with better performance.

Figure 4:
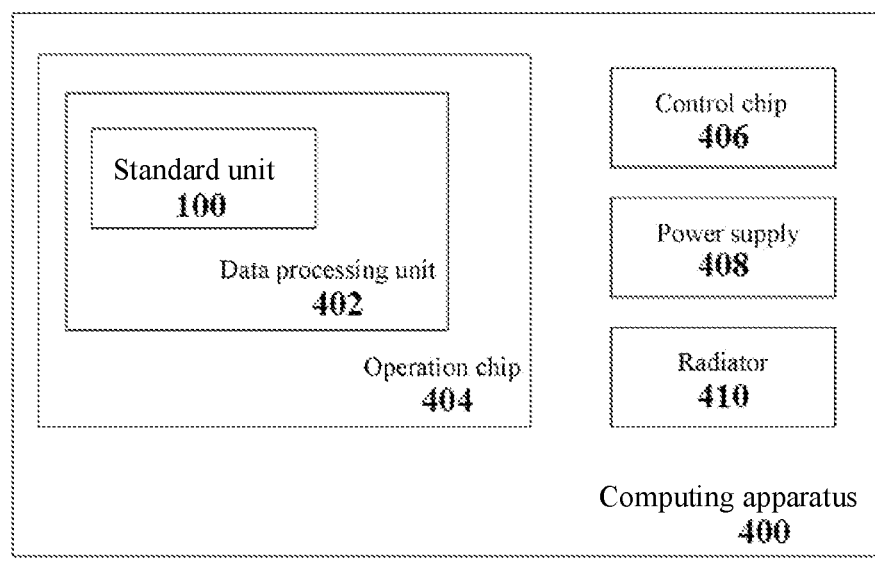
FIG. 4 exemplarily shows a schematic diagram of the data processing unit, the operation chip, and the computing apparatus according to an embodiment of the present disclosure.

FIG. 4 exemplarily shows a schematic diagram of the data processing unit, the operation chip, and the computing apparatus according to an embodiment of the present disclosure.

According to an embodiment of the present disclosure, the data processing unit 402 is further provided. Referring to FIG. 4, the data processing unit 402 includes at least one standard unit 100 described above. In some embodiments, the data processing unit 402 may include both the standard unit 100 using the hybrid threshold technology shown in FIG. 1 of the present application and the conventional standard unit using the single threshold type. The data processing unit 402 may be configured to implement relatively simple data processing functions, and may be the adder, the multiplier and the like for example. One skilled in the art may understand that although the data processing unit 402 shown in FIG. 4 is a part of the computing apparatus 400, the data processing unit 402 may also be used alone as an independent component.

According to an embodiment of the present disclosure, the operation chip 404 is further provided. Referring to FIG. 4, the operation chip 404 includes at least one data processing unit 402 described above. The operation chip 404 may be configured to implement relatively complex operation functions, for example, to implement a certain algorithm (such as the hash algorithm). One skilled in the art may understand that although the operation chip 404 shown in FIG. 4 is a part of the computing apparatus 400, the operation chip 404 may also be used alone as an independent component.

According to an embodiment of the present disclosure, the computing apparatus 400 is further provided, which may be configured to perform the algorithm of mining virtual digital currency. Referring to FIG. 4, the computing apparatus 400 may include: at least one operation chip 404 described above, the control chip 406, the power supply module 408 and the radiator 410. The control chip 406 is coupled to the at least one operation chip 404; the power supply module 408 may be configured to provide power to the at least one operation chip 404, the control chip 406, and/or the radiator 410; and the radiator 410 may be configured to dissipate heat for the at least one operation chip 404, the control chip 406, and/or the power supply module 408. In a preferred embodiment, the computing apparatus 400 may be configured, for example, to perform the hash algorithm for mining bitcoins.

The words "front", "rear", "top", "bottom", "above", "under" and the like in the description and the claims, if present, are used for a descriptive purpose and are not necessarily used for describing the unchanged relative position. It should be understood that the words used in such a way are interchangeable in proper circumstances so that the embodiments of the present disclosure described herein, for example, can be operated in other orientations that are different from those shown herein or those described otherwise.

As used herein, the word "exemplary" means "serving as an example, instance, or illustration" rather than as a "model" to be exactly reproduced. Any implementation exemplarily described herein is not necessarily to be explained as preferred or advantageous over other implementations. In addition, the present disclosure is not limited by any stated or implied theory provided in the technical field, background, summary or detailed description.

As used herein, the word "substantially" means that any minor variation caused by the deflect of the design or manufacture, the tolerance of the device or the element, the environmental influence, and/or other factors is included. The word "substantially" also allows for the difference from the perfect or ideal situation caused by the parasitic effect, noise, and other practical considerations that may exist in the actual implementation.

Moreover, elements, nodes, or features that are "connected" or "coupled" together may be mentioned in the description of the text. As used herein, unless expressly stated otherwise, "connect" means that one element/node/feature is directly connected (or directly communication) to another element/node/feature electrically, mechanically, logically, or in other manners. Similarly, unless expressly stated otherwise, "couple" means that one element/node/feature may be directly or indirectly linked with another element/node/feature mechanically, electrically, logically or in other manners, to allow an interaction, even though the two features may not be directly connected. That is, "couple" intends to include both direct and indirect links of the element or other features, including the connections using one or more intermediate elements.

Furthermore, terms like "first" and "second" and so on may also be used herein for a reference purpose only, and thus are not intended for a limitation. For example, the terms "first" "second" and other such numerical terms relating to the structure or element do not imply the sequence or the order unless the context clearly indicates otherwise.

It should be further understood that the word "comprise/include", when used herein, specifies the presence of stated features, integers, steps, operations, units, and/or components, but do not preclude the presence or addition of one or more other features, integers, steps, operations, units, and/or components, and/or combinations thereof.

In the present disclosure, the term "provide" is used broadly for covering all manners of obtaining the object, therefore "provide some object" includes, but not limited to, "purchase", "prepare/manufacture", "arrange/set", "install/assemble", and/or "order" object.

One skilled in the art should realize that the boundary between the foregoing operations is merely illustrative. A plurality of operations may be combined into a single operation, and the single operation may be distributed among additional operations, and the operations may be performed at least partially overlap in time. In addition, alternative embodiments may include the plurality of instances of the particular operation, and the operation order may be changed in other various embodiments. However, other modifications, changes, and replacements are also possible. Therefore, the description and accompanying drawings are to be regarded as illustrative rather than limited.

Although some specific embodiments of the present disclosure have been described in detail through examples, one skilled in the art may understand that the foregoing examples are only for description, but not for limiting the scope of the present disclosure. Each embodiment disclosed herein may be randomly combined without departing from the spirit and scope of the present disclosure. It may also be understood by one skilled in the art that various modifications may be made to the embodiments without departing from the scope and spirit of the present disclosure. The scope of the present disclosure is limited by the appended claims.

What is claimed is:

1. A standard unit for a system on chip design, comprising a plurality of semiconductor devices and configured to implement a basic logic function, wherein the plurality of semiconductor devices comprise:
   a first transistor of a first threshold type; and
   a second transistor of a second threshold type, wherein when the second transistor has a same threshold type as that of the first transistor, a second path speed of the second transistor is lower than a first path speed of the first transistor;
   wherein a threshold of the first threshold type is selected to be higher than that of the second threshold type to balance the first path speed of the first transistor and the second path speed of the second transistor, so that rising delay time and falling delay time of the standard unit are balanced.

2. The standard unit according to claim 1, wherein the plurality of semiconductor devices further comprise:
   a third transistor of a third threshold type;
   wherein a threshold range of the third threshold type is different from that of the first threshold type and is different from that of the second threshold type; and
   wherein rising delay time and falling delay time of the standard unit are made to be balanced by selecting the first threshold type, the second threshold type and the third threshold type.

3. The standard unit according to claim 2, wherein the first threshold type, the second threshold type, or the third threshold type is selected from the following: a regular threshold (RVT) type, a low threshold (LVT) type, a super low threshold (SLVT) type, and a high threshold (HVT) type.

4. The standard unit according to claim 1, wherein the first transistor is an n-type transistor and the second transistor is a p-type transistor; or
   wherein the first transistor is a p-type transistor and the second transistor is an n-type transistor.

5. The standard unit according to claim 1, wherein the first transistor and the second transistor are both n-type transistors or are both p-type transistors.

6. The standard unit according to claim 1, wherein the standard unit is an inverter, the first transistor is a p-type transistor of a low threshold (LVT) type, the second transistor is an n-type transistor of a super low threshold (SLVT) type, gates of the first transistor and the second transistor are connected to an input end of the standard unit, and drains of the first transistor and the second transistor are connected to an output end of the standard unit.

7. A data processing unit, comprising at least one standard unit according to claim 1.

8. An operation chip, comprising at least one data processing unit according to claim 7.

9. A computing apparatus, wherein the computing apparatus is configured to perform an algorithm of mining virtual digital currency, and the computing apparatus comprises:
   at least one operation chip according to claim 8;
   a control chip;
   a power supply module; and
   a radiator;
   wherein the control chip is coupled to the at least one operation chip and is configured to control operation of the at least one operation chip;
   wherein the power supply module is configured to provide power to the at least one operation chip, the control chip, and/or the radiator; and
   wherein the radiator is configured to dissipate heat for the at least one operation chip, the control chip, and/or the power supply module.

* * * * *